United States Patent
Kim

(10) Patent No.: US 7,668,036 B2
(45) Date of Patent: Feb. 23, 2010

(54) APPARATUS FOR CONTROLLING GIO LINE AND CONTROL METHOD THEREOF

(75) Inventor: Jee Yul Kim, Icheon-si (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 106 days.

(21) Appl. No.: 11/755,465

(22) Filed: May 30, 2007

(65) Prior Publication Data

US 2008/0112252 A1     May 15, 2008

(30) Foreign Application Priority Data

Nov. 14, 2006   (KR) .................. 10-2006-0112134

(51) Int. Cl.
*G11C 8/00*   (2006.01)

(52) U.S. Cl. .............. 365/230.06; 365/189.15; 365/189.17; 365/189.19; 365/189.05; 365/230.05; 365/230.08

(58) Field of Classification Search ........... 365/230.06, 365/189.15, 189.16, 189.17, 189.18, 189.05, 365/230.05, 230.08
See application file for complete search history.

(56) References Cited

U.S. PATENT DOCUMENTS 6,166,967 A * 12/2000 Do ...................... 365/189.07
6,462,998 B1 * 10/2002 Proebsting ................. 365/205
7,088,150 B2 *  8/2006 Balhiser et al. ............. 327/108
2006/0221717 A1 * 10/2006 Lee ...................... 365/189.04

FOREIGN PATENT DOCUMENTS

KR   10-2003-0090955   12/2003
KR         100631174    9/2006

OTHER PUBLICATIONS

Office Action dated Jul. 30, 2009, for Korean application No. 10-2006-0112134.

* cited by examiner

*Primary Examiner*—Amir Zarabian
*Assistant Examiner*—Fernando N Hidalgo
(74) *Attorney, Agent, or Firm*—Lowe Hauptman Ham & Berner, LLP

(57) ABSTRACT

A control apparatus of a GIO line includes a plurality of GIO line termination units, and a GIO control unit for generating a control signal to activate an operation of a specific one of the plurality of GIO termination units according to a data transmission method. Further, a method of controlling a GIO line through GIO termination includes the step of generating a control signal to activate an operation of a specific one of a plurality of GIO termination units according to a data transmission method.

29 Claims, 8 Drawing Sheets

APPARATUS FOR CONTROLLING GIO LINE AND CONTROL METHOD THEREOF

CROSS-REFERENCES TO RELATED APPLICATIONS

The present application claims priority to Korean patent application number 10-2006-112134, filed on Nov. 14, 2006, which is incorporated by reference in its entirety.

BACKGROUND OF THE INVENTION

The present invention relates, in general, to a control apparatus of a Global Input Output (GIO) line and a control method thereof and, more particularly, to an apparatus for controlling a GIO line and a control method thereof in which a GIO termination unit included in a GIO line, that is, a shared line between banks is controlled according to a GIO line group, so that only a GIO termination unit with respect to some GIO line groups is operated according to a data transmission method.

In general, data lines used in a semiconductor memory device are classified into Segment I/O (SIO) lines, Local I/O (LIO) lines, and GIO lines and so on according to their locations.

The role of each IO line according to the read path is described below. After data of a cell bit line is amplified in response to a column select signal, it is loaded on the SIO lines. The data loaded on the SIO lines is loaded on the LIO lines that share the SIO lines of the cell segment blocks. The data loaded on the LIO lines normally drives a read driver. The data is inverted and amplified and is then loaded on the GIO lines. The GIO lines are bank sharing lines and are driven by respective banks. The data of the GIO lines is output through a desired data pad by means of a receiver, so that a read operation is performed.

In the above structure, however, the chip area is increased as the capacity of a semiconductor device increases. If the length of the GIG line is lengthened, the data of the GIO line is toggled through full swing, thereby making a signal delayed and making a high-speed operation difficult. There is also a problem in that coupling noise in which neighboring lines are affected occurs severely. To solve the problems, there was disclosed a method of using a GIO termination structure (Korean Patent Registration No. 10-0631174).

In the GIO termination structure disclosed in the above patent, the structure of a data output device for the GIO lines is improved in order to reduce the swing width of data transmitted through the GIO lines, enable high-speed data transmission, and reduce coupling noise with respect to neighboring lines.

In using the GIO termination structure, there are no significant problems in the case of X16 products because the entire GIO lines are used. In the case of X8 or X4 products, however, power is unnecessarily consumed because the whole GIO lines are terminated.

SUMMARY OF THE INVENTION

Accordingly, the present invention addresses the above problems, and discloses a control apparatus of a GIO line and a control method thereof, in which GIO termination units are separately constructed so that specific GIO line groups can be terminated separately, and whether to operate a specific GIO termination unit can be controlled according to a data transmission method.

In an aspect, there is provided a control apparatus of a GIO line includes a plurality of GIO line termination units, and a GIO control unit for generating a control signal to activate an operation of a specific one of the plurality of GIO termination units according to a data transmission method.

In another aspect, there is provided a method of controlling a GIO line through GIO termination, including the step of generating a control signal to activate an operation of a specific one of a plurality of GIO termination units according to a data transmission method.

DESCRIPTION OF SPECIFIC EMBODIMENTS

Now, specific embodiments according to the present patent will be described with reference to the accompanying drawings.

Figure 1:
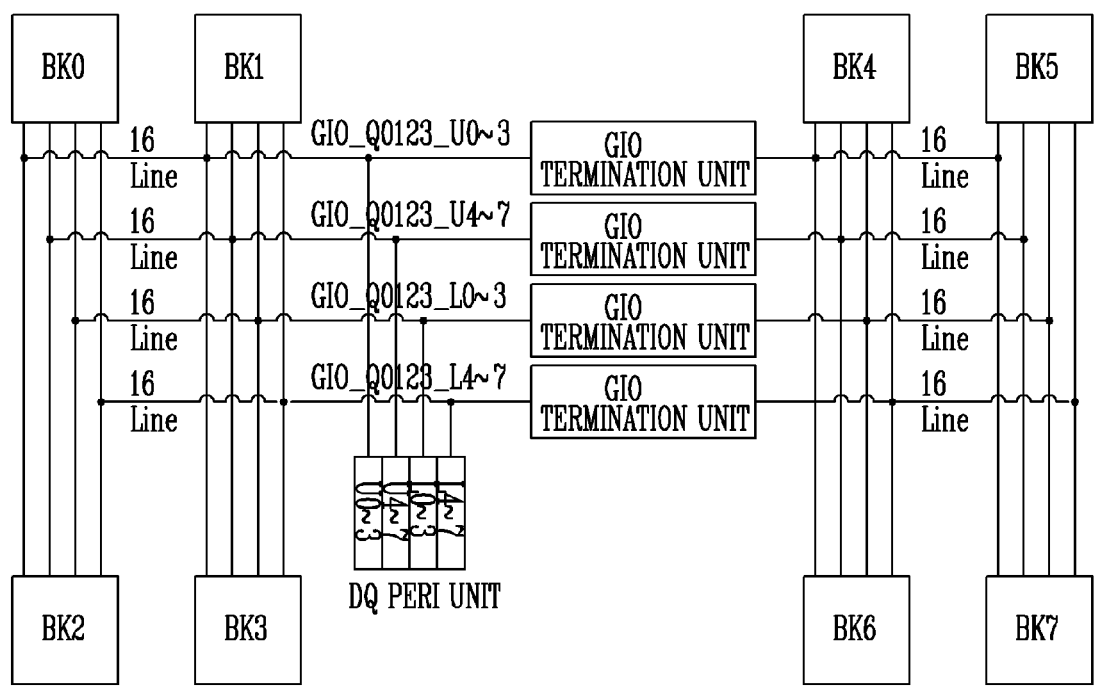
FIG. 1 is a view illustrating a memory bank structure of DRAM to which the present invention is applied.

FIG. 1 is a view illustrating a memory bank structure of DRAM to which the present invention is applied. There is shown in FIG. 1 a memory bank structure of 1 Gb capacity grade. The memory device includes eight banks BK0, BK1, ... BK7, a plurality of GIO lines connecting the banks, and a plurality of GIO termination units, and DQ peri units connected between the GIO lines.

Each of the GIO lines includes 16 lines, and each of the GIO termination units is responsible for 16 GIO lines.

Meanwhile, if four or eight data are sequentially input every data I/O pin (DQ, not illustrated), Q0, Q1, Q2 and Q3 are arranged in the DQ peri unit in this order. For example, GIO_Q0123_U0~3 illustrated in the drawing means 16 lines in which 16 data input to UDQ0~3 are arranged in parallel.

In this case, in the prior art, the GIO termination unit is controlled to terminate the whole GIO line regardless of whether it is used as X16, X8 or X4. Thus, the present invention is intended to present a GIO control apparatus that can change GIO lines that are terminated in the case where the GIO termination unit is used as X8 or X4. The GIO termination circuit is first described before the GIO control apparatus is described.

Figure 2:
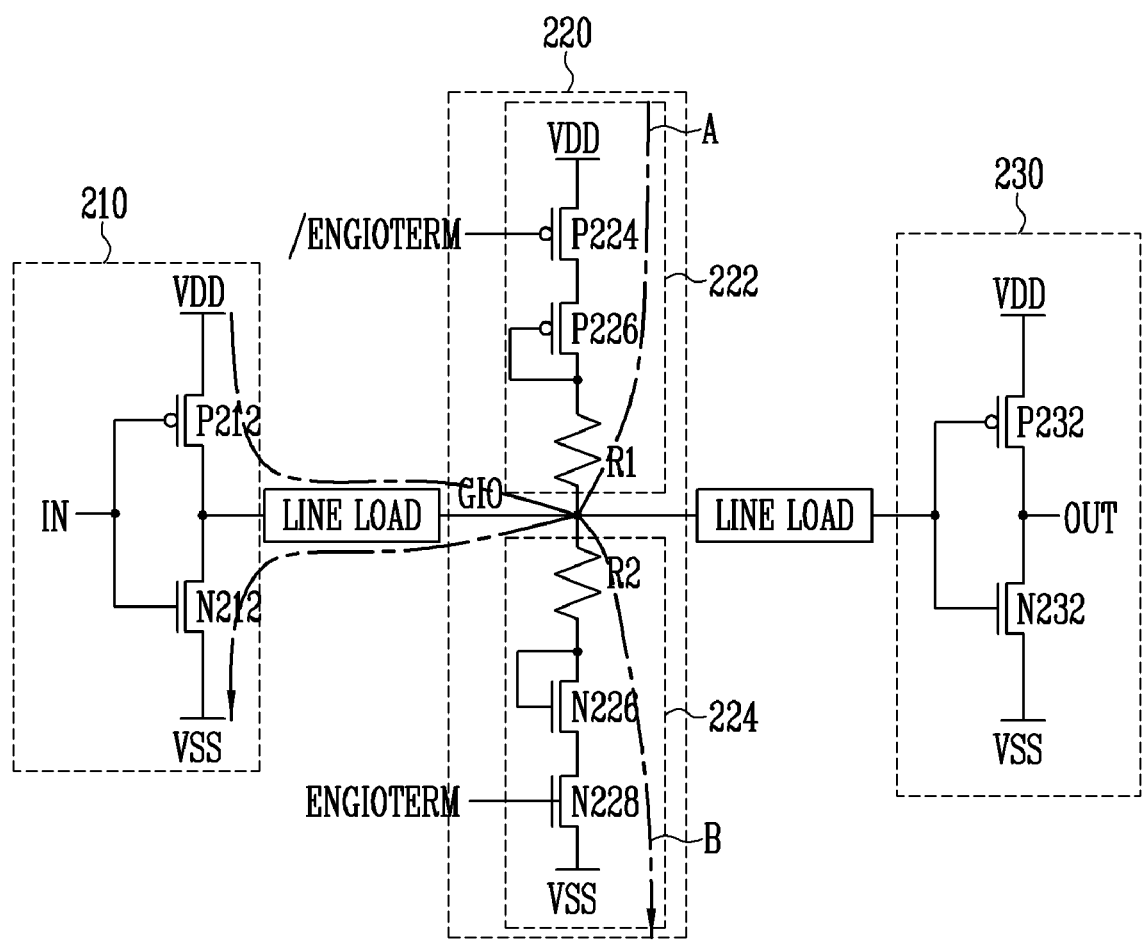
FIG. 2 is a circuit diagram of a GIO termination circuit to which the present invention is applied.

FIG. 2 is a circuit diagram of the GIO termination circuit to which the present invention is applied. There are shown in FIG. 2 a read driver 210 and a receiver 230 as well as a GIO termination unit 220.

The read driver 210 is driven according to lead data applied to an input terminal IN, and serves to invert and amplify the lead data and outputs it to the GIO line. The read driver 210 is a CMOS inverter, and is connected in series between a power supply voltage VDD and a ground voltage VSS. The read driver 210 includes a PMOS transistor P212 and an NMOS transistor N212 having both gates commonly connected and applied with the lead data.

The GIO termination unit 220 is provided on the GIO line. The GIO termination unit 220 is driven according to a termination signal, and previously raises or lowers the voltage level of the GIO line to some extent before the lead data is driven to the GIO line by the read driver 210, more particularly, before the lead data is input to the input terminal IN of the read driver 210, reducing the swing width of data transmitted through the GIO line.

The GIO termination unit 220 includes a low current sink unit 222 and a high current sink unit 224.

The low current sink unit 222 generates a current sink path via the NMOS transistor N212 of the read driver 210 when the GIO line is driven by "L", reducing the swing width of data driven. The low current sink unit 222 includes a PMOS transistor P224, a PMOS diode P226 and a resistor R1 all of which are connected in series between the power supply voltage VDD and the GIO line. The PMOS transistor P224 has the gate applied with a first termination signal /ENGIOTERM.

The high current sink unit 224 generates a current sink path via the PMOS transistor P212 of the read driver 210 when the GIO line is driven by "H", reducing the swing width of data driven. The high current sink unit 224 includes a resistor R2, an NMOS diode N226 and an NMOS transistor N228 all of which are connected in series between the GIO line and the ground voltage VSS. The NMOS transistor N228 has the gate applied with a second termination signal ENGIOTERM.

The receiver 230 is driven according to data transmitted through the GIO line. The receiver 230 inverts and amplifies the data, and outputs the resulting data. The receiver 230 is a CMOS inverter, and includes a PMOS transistor P232 and an NMOS transistor N232. The PMOS transistor P232 and the NMOS transistor N232 are connected in series between the power supply voltage VDD and the ground voltage VSS, and have gates commonly connected and connected to the GIO line.

Figure 3:
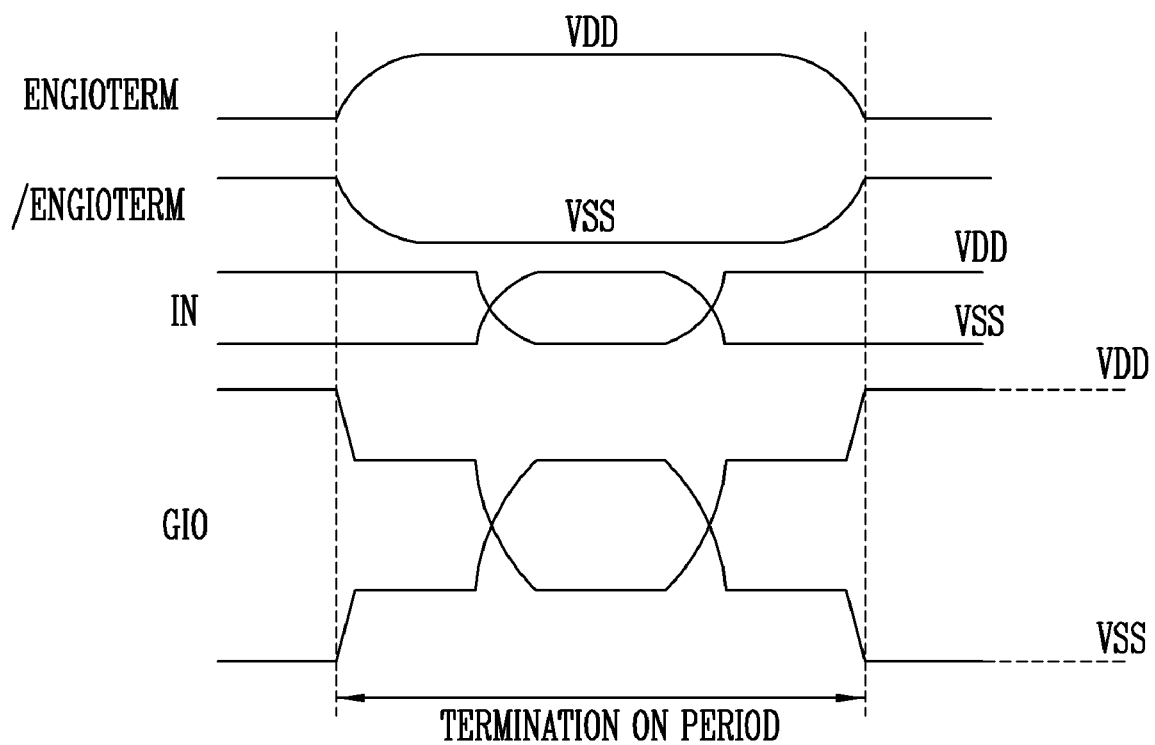
FIG. 3 is a timing diagram illustrating an operation of the GIO termination circuit shown in FIG. 2.

FIG. 3 is a timing diagram illustrating an operation of the GIO termination circuit shown in FIG. 2.

Before the lead data is applied to the input terminal IN of the read driver 210, the first termination signal /ENGIOTERM and the second termination signal ENGIOTERM are activated to "L" and "H", respectively. As the first termination signal /ENGIOTERM is activated, the PMOS transistor P224 of the low current sink 222 is turned, and as the second termination signal ENGIOTERM is activated, the NMOS transistor N228 of the high current sink 224 is turned (termination on). Thus, the voltage of the GIO line is precharged with a constant level, which is lower than the power supply voltage VDD, but higher than the ground voltage VSS.

Thereafter, if the lead data is applied to the input terminal IN of the read driver 210, one of the PMOS transistor P212 and the NMOS transistor N212 is turned on according to its data value, so that a current sink path is established between the read driver 210 and the GIO termination unit 220. For example, in the case where the lead data of "H" is applied to the read driver 210 and "L" data is driven to the GIO line, the NMOS transistor N212 is turned on to connect the GIO line to the ground voltage VSS, so that a current sink path A is formed between the low current sink unit 220 and the read driver 210. However, in the case where the lead data of "L" is applied to the read driver 210 and "H" data is driven to the GIO line, the PMOS transistor P212 is turned on to connect the GIO line to the power supply voltage VDD, so that a current sink path B is formed between the read driver 210 and the high current sink unit 224. In this case, the amount of current terminated is controlled by the resistors R1 and R2.

As described above, the current sink path causes the voltage level of the GIO line to maintain a voltage level generated by the GIO termination unit 220 so that the voltage level of the GIO line is not raised to a power supply voltage level or lowered to a ground voltage level again by means of the data inverted and amplified in the read driver 210. Thus, the data, inverted in the read driver 210 and then driven in the GIO line, does not full swing, but swing in a level generated by the GIO termination unit 220. Therefore, the swing width of the date becomes small, enabling rapid signal transfer. Accordingly, coupling noise with respect to neighboring lines, which is generated since the voltage level of the GIO line is low while the data is transmitted, can be decreased.

Figure 4:
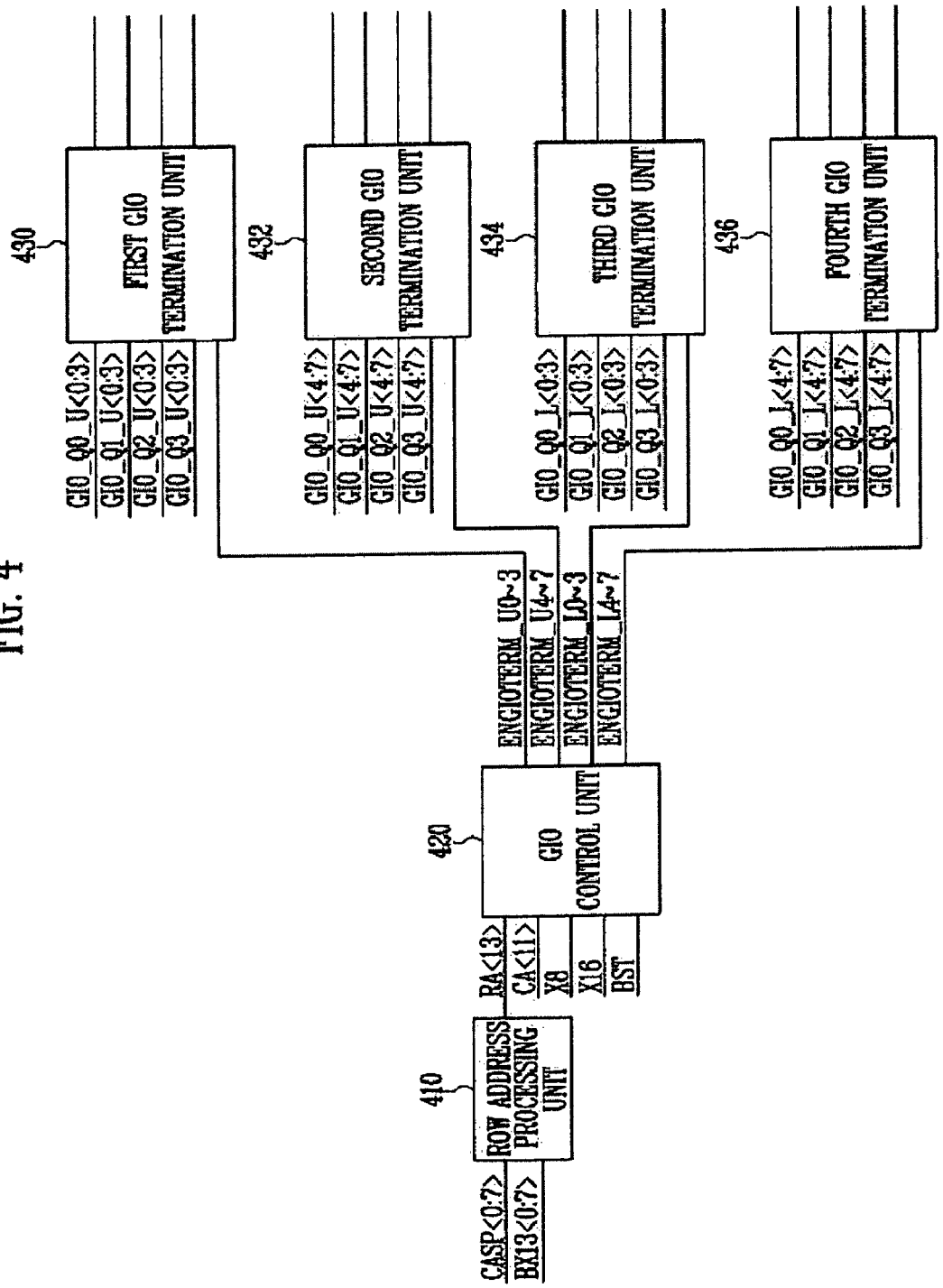
FIG. 4 is a view illustrating a GIO control apparatus according to an embodiment of the present invention.

FIG. 4 is a view illustrating the GIO control apparatus according to an embodiment of the present invention.

The GIO control apparatus includes a GIO control unit 420, first to fourth GIO termination units 430, 432, 434 and 436, and a row address processing unit 410 for processing a row address signal RA<13> input to the GIO control unit 420.

The GIO control unit 420 generates a control signal to activate the operation of a specific one of the plurality of GIO termination units according to a data transmission method. In particular, the GIO control unit 420 receives a row address signal RA<13>, a column address signal CA<11>, data transmission method select signals X8 and X16, and a unit pulse signal BST, and generates the termination signal ENGIOTERM to control whether to operate a specific one of the four GIO termination units 430, 432, 434 and 436. A detailed construction of the control unit is described later on.

The first GIO termination unit 430 terminates the GIO lines GIO_Q0_U<0:3>, GIO_Q1_U<0:3>, GIO_Q2_U<0:3> and GIO_Q3_U<0:3>, respectively, along which 16 data input through the data I/O pad UDQ0~UDQ3 are transmitted in response to the first termination signal ENGIOTERM_U0~3 received from the GIO control unit 420.

The second GIO termination unit 432 terminates the GIO lines GIO_Q0_U<4:7>, GIO_Q1_U<4:7>, GIO_Q2_U<4:7> and GIO_Q3_U<4:7>, respectively, along which 16 data input through the data I/O pad UDQ4~UDQ7 are transmitted in response to the second termination signal ENGIOTERM_U4~7 received from the GIO control unit 420.

The third GIO termination unit 434 terminates the GIO lines GIO_Q0_L<0:3>, GIO_Q1_L<0:3>, GIO_Q2_L<0:3> and GIO_Q3_L<0:3>, respectively, along which 16 data input through the data I/O pad LDQ0~LDQ3 are transmitted in response to the third termination signal ENGIOTERM_L0~3 received from the GIO control unit 420.

The fourth GIO termination unit 436 terminates the GIO lines GIO_Q0_L<4:7>, GIO_Q1_L<4:7>, GIO_Q2_L<4:7> and GIO_Q3_L<4:7>, respectively, along which 16 data input through the data I/O pad LDQ4~LDQ7 are transmitted in response the fourth termination signal ENGIOTERM_L4~7 received from the GIO control unit 420.

Each termination unit includes four termination circuits described with reference to FIG. 2, and is controlled according to each termination signal.

Figure 5:
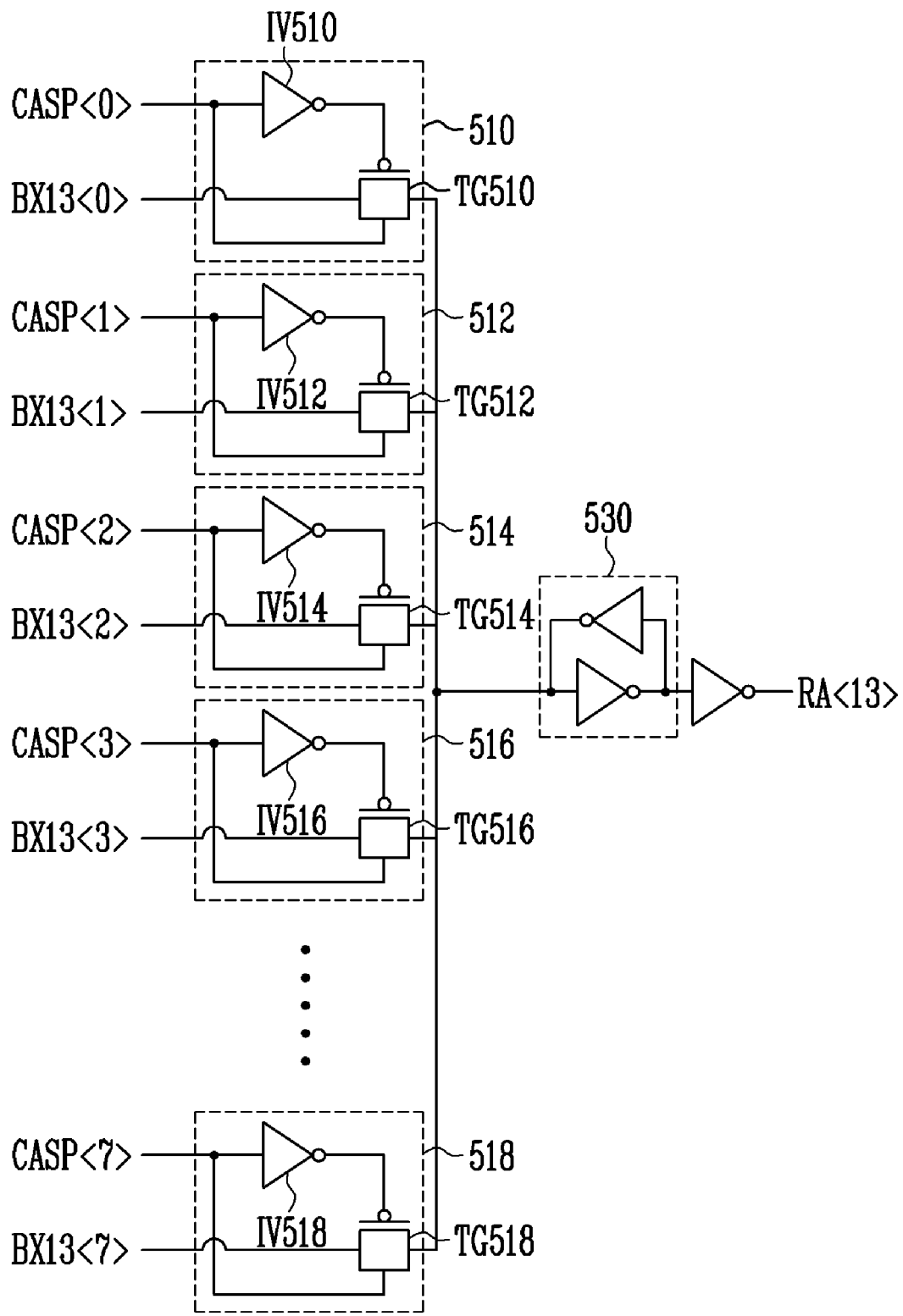
FIG. 5 is a detailed circuit diagram of a row address processing unit shown in FIG. 4.

FIG. 5 is a detailed circuit diagram of the row address processing unit 410 shown in FIG. 4.

The row address processing unit 410 receives a CAS command signal (CASP, a signal of a pulse form, which is enabled when a read or write command is applied) with respect to a specific one of a plurality of banks, and a block address signal BX13 with respect to a specific bank, and generates the row address signal RA<13>. The row address processing unit 410 includes address signal storage units 510, 512, ..., 518 in which whether the block address signal BX13 will be transferred according to the CAS command signal CASP, and a latch unit 530 for temporarily storing signals output from the respective storage units 510, 512, ..., 518.

The address signal storage unit 510 includes a transfer gate TG510 controlled according to the CAS command signal CASP<0>, and an input terminal of the block address signal BX13<0>, which is connected to the transfer gate TG510. The address signal storage unit 510 further includes an inverter IV510 for inverting the CAS command signal CASP<0> and applying it to the gate of the transfer gate TG510. Therefore, if the CAS command signal CASP<0> becomes a high level, the block address signal BX13<0> is transferred to the latch unit 530 without change.

The remaining address signal storage units 512, 514, ... 518 transfer the block address signals BX13<0>, ... BX13<7>, respectively, according to the CAS command signals CASP<0>, ... CASP<7>, respectively.

Figure 6A:
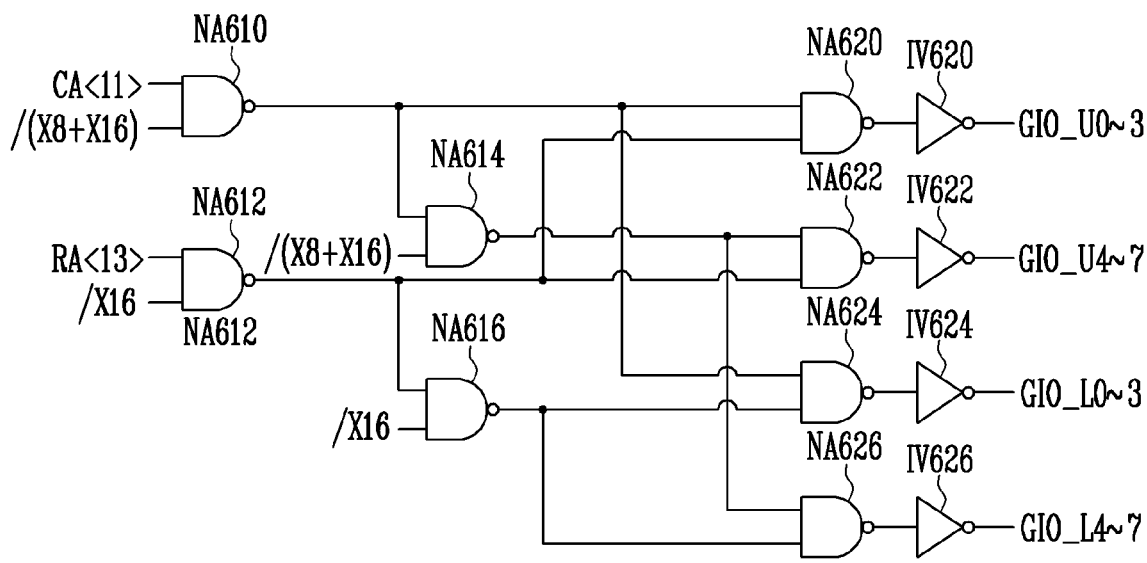
FIG. 6A is a circuit diagram of a GIO line group selection unit for selecting a specific GIO line group.
Figure 6B:
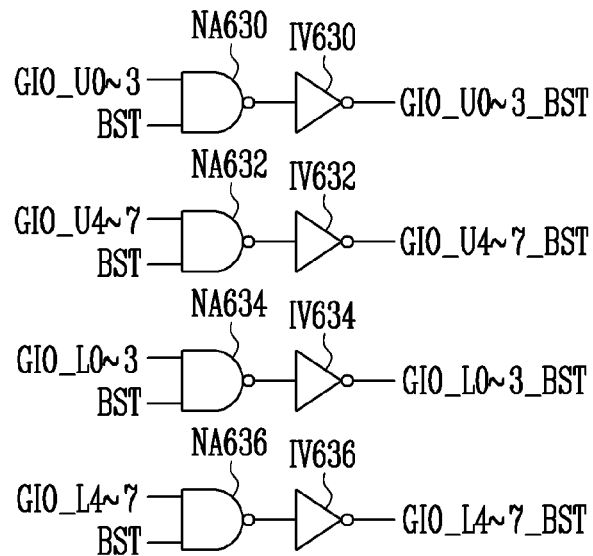
FIG. 6B is a circuit diagram of a normalization unit for normalizing a pulse width of a GIO line group select signal.
Figure 6C:
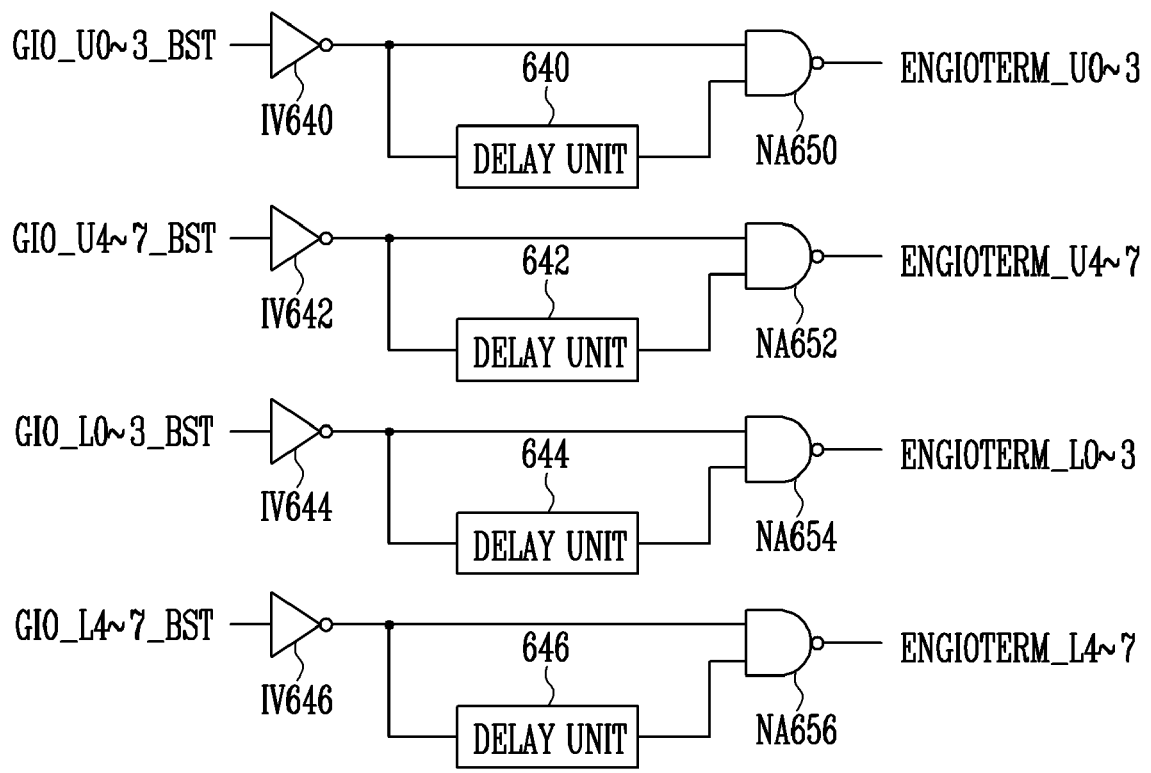
FIG. 6C is a circuit diagram of a signal extension unit for extending the width of a normalized GIO line group select signal to some extent.

FIGS. 6A, 6B and 6C are circuit diagrams illustrating a detailed construction block of the GIO control unit 420 according to an embodiment of the present invention. FIG. 6A illustrates the GIO line group selection unit for selecting a specific GIO line group by using the row address signal RA<13>, the column address signal CA<11> and the data transmission method select signals X8 and X16 as inputs.

The GIO line group selection unit includes a NAND gate NA610 for receiving the column address signal CA<11> and the data transmission method select signal /X8+X16 as the inputs, a NAND gate NA612 for receiving the row address signal RA<13> and the data transmission method select signal /X16 as the inputs, a NAND gate NA614 for receiving the output signal of the NAND gate NA610 and the data transmission method select signal /X8+X16 as the inputs, and a NAND gate NA616 for receiving the output signal of the NAND gate NA612 and the data transmission method select signal /X16 as the inputs. The GIO line group selection unit further includes a NAND gate NA620 for receiving the output signals of the NAND gate NA610 and the NAND gate NA612 as the inputs, a NAND gate NA622 for receiving the output signals of the NAND gate NA614 and the NAND gate NA612 as the inputs, a NAND gate NA624 for receiving the output signals of the NAND gate NA610 and the NAND gate NA616 as the inputs, a NAND gate NA626 for receiving the output signals of the NAND gate NA614 and the NAND gate NA616 as the inputs, and inverters IV620, IV622, IV624 and IV626 for inverting the outputs of the NAND gate NA620, NA622, NA624 and NA626, respectively, and outputting the resulting signals.

It is determined how many GIO line groups will be selected by the data transmission method select signals X8 and X16 through the above construction. In other words, if select signals all have a low level, it is determined as X4 form. If only one GIO line group is selected and only the select signal X8 has a high level, two GIO line groups are selected. If the select signal X16 has a high level, four GIO line groups are all selected.

It is also determined which one of the GIO line groups will be selected by the row address signal RA<13> and the column address signal CA<1>. In other words, in the case where only one GIO line group is selected by the data transmission method select signals X8 and X16, it is determined which one of the four 10 line groups GIO_U0~3, GIO_U4~7, GIO_L0~3 and GIO_L4~7 will be selected. This is true of when two GIO line groups are selected.

In the present invention, in the case where the data transmission method select signal X8 becomes a high level, the GIO line groups GIO_U0~3 and GIO_U4~7 or the GIO line groups GIO_L0~3 and GIO_L4~7 are terminated by the row address signal RA<13>.

In the case where both the data transmission method select signals X8 and X16 become a low level, that is, in the case where data is transmitted in X4 form, whether the GIO line groups GIO_U0~3 and GIO_U4~7 or the GIO line groups GIO_L0~3 and GIO_L4~7 will be terminated is selected by the row address signal RA<13>, the GIO line group GIO_U0~3 or the GIO line group GIO_U4~7 is selected by the column address signal CA<11>, or the GIO line group GIO_L0~3 or the GIO line group GIO_L4~7 is selected.

Meanwhile, the GIO control unit includes a pulse width control unit (not illustrated) for controlling the pulse width of an output signal of the GIO termination select unit. The pulse width control unit includes the normalization unit (illustrated in FIG. 6B) for normalizing the pulse width of an output signal of the GIO termination select unit, and the signal extension unit (illustrated in FIG. 6C) for extending the output signal of the normalization unit for a specific period of time.

FIG. 6B is a circuit diagram of the normalization unit for normalizing the pulse width of the GIO line group select signal The normalization unit normalizes the pulse width of an output signal of the GIO termination select unit to the pulse width of a pulse signal in response to the output signal of the GIO termination select unit and a pulse signal having a pulse width.

The normalization unit includes a NAND gate NA630 for receiving the GIO line group select signal GIO_U0~3 and the unit pulse signal BST as the inputs, a NAND gate NA632 for receiving the GIO line group select signal GIO_U4~7 and the unit pulse signal BST as the inputs, a NAND gate NA634 for receiving the GIO line group select signal GIO_L0~3 and the unit pulse signal BST as the inputs, and a NAND gate NA636 for receiving the GIO line group select signal GIO_L4~7 and the unit pulse signal BST as the inputs. The normalization unit further includes inverters IV630, IV632, IV634 and IV636 for inverting the outputs of the NAND gates NA630, NA632, NA634 and NA636, respectively.

Through the above construction, the pulse widths of GIO line group select signals having an irregular pulse width can be normalized as much as the pulse width of the unit pulse signal BST having a specific pulse width. Output signals in this case are referred to as normalized GIO line group select signals GIO_U0~3_BST, GIO_U4~7_BST and GIO_L0~3_BSTGIO_L4~7_BST.

FIG. 6C is a circuit diagram of the signal extension unit for extending the width of the normalized GIO line group select signal to some extent.

The signal extension unit includes inverters IV640, IV642, IV644 and IV646 for inverting the levels of the normalized GIO line group select signals GIO_U0~3_BST, GIO_U4~7_BST and GIO_L0~3_BSTGIO_L4~7_BST, respectively, delay units 640, 642, 644 and 646 for delaying the outputs signals of the inverters IV640, IV642, IV644 and IV646 for a specific period of time, and NAND gates NA650, NA652, NA654 and NA656 for receiving the output signals of the inverters IV640, IV642, IV644 and IV646, respectively, and the output signals of the delay units 640, 642, 644 and 646, respectively.

Through the above construction, a NAND operation is performed on an inverted signal of the GIO line group select signal and a signal in which the inverted signal is partially delayed. Thus, the output signal has a high level when both signals have a low level or different levels, and has a low level when both signals have a high level. In this case, both signals have a difference as much as delayed time, but have the same pulse form. Therefore, the pulse width of a GIO line group select signal that is originally input is extended as long as the delayed time.

Figure 7:
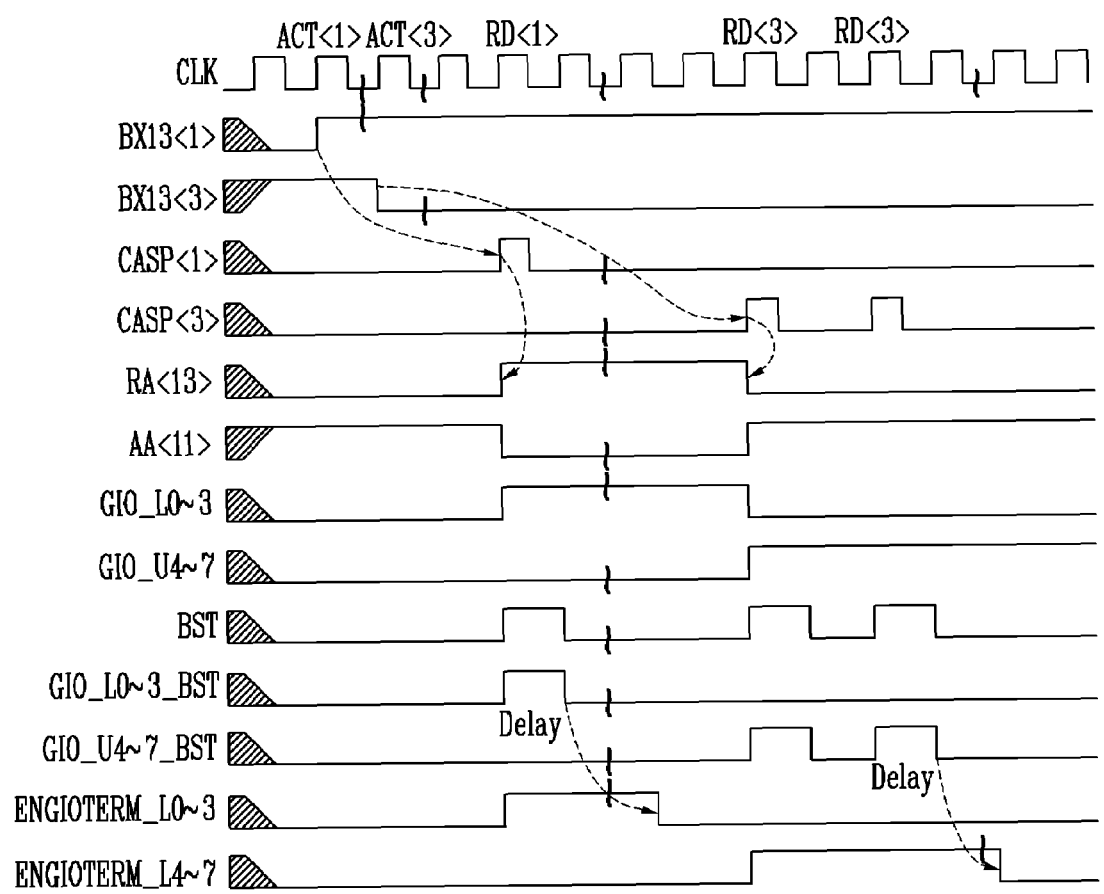
FIG. 7 is a waveform illustrating the operation of the circuit according to an embodiment of the present invention.

FIG. 7 is a waveform illustrating the operation of the circuit according to an embodiment of the present invention.

Active signals ACT<1> and ACT<3> and read signals RD<1> and RD<3> with respect to bank 1 and 3 are input in synchronization with a clock signal. In this case, though not illustrated in the drawing, both the data transmission method select signals X8 and X16 are decided as a low level, and the data transmission method is decided as X4

The block address signal BX13<1> is shifted to a high level in synchronization with the active signal ACT<1>, and the block address signal BX13<3> is shifted to a low level in synchronization with the active signal ACT<3>. Furthermore, the address signals CASP<1> and CASP<3> of each bank have a pulse of a high level in synchronization with the read signals RD<1> and RD<3>.

Meanwhile, the row address processing unit 410 receives the block address signal BXi3<1> and the address signal CASP<i>, and outputs the row address signal RA<13> that shifts to a high level. The row address signal RA<13> is shifted again to a low level by means of the block address signal BXi3<3> and the address signal CASP<3>.

The column address signal CA<11> has a signal, which is inverted from the row address signal RA<13>.

In this case, the row address signal RA<13> has a high level, the column address signal CA<11> has a low level, and both the data transmission method select signals X8 and X16 have a low level. Thus, the GIO line group selection unit of the FIG. 6A shifts the signal GIO_L0~3, which drives the third termination unit, to a high level. As the row address signal RA<13> shifts to a low level and the column address signal CA<1> shifts to a high level, the GIO line group selection unit shifts the signal GIO_U4~7, which drives the second termination unit, to a high level.

The normalization unit generates the signals GIO_L0~3_BST and GIO_U4~7_BST in which the GIO line group select signals GIO_L0~3 and GIO_U4~7 are normalized with respect to the unit pulse signal BST.

The signal extension unit generates the third termination signal ENGIOTERM_L0~3 and the second termination signal ENGIOTERM_U4~7 in which the normalized signals GIO_L0~3_BST and GIO_U4~7_BST are extended for a specific period of time.

As described above, the GIO control unit can receive a specific address signal and a data transmission method select signal, and determined whether to terminate a specific GIO line.

As described above, according to the present invention, when the data transmission method is X4 and X8, the entire GIO lines are not terminated, but some of the GIO lines are terminated. Accordingly, unnecessary power consumption can be saved compared with a control apparatus in which the entire GIO lines are terminated.

Although the foregoing description has been made with reference to the various embodiments, it is to be understood that changes and modifications of the present patent may be made by the ordinary skilled in the art without departing from the spirit and scope of the present patent and appended claims.

What is claimed is:

1. A control apparatus of GIO lines, comprising:
   a plurality of Global Input Output (GIO) line termination units, and
   a GIO control unit for generating a plurality of control signals each of which corresponds to each of the plurality of GIO line termination units, so that one or more of the plurality of GIO line termination units are terminated in accordance with a data transmission method, and one or more of the plurality of GIO line termination units are not terminated,
   wherein the GIO control unit comprises:
   a GIO termination select unit for outputting a signal to determine whether to terminate a specific GIO line group in response to a column address signal, a row address signal and a data transmission method select signal.

2. The control apparatus of claim 1, wherein the respective termination units raise or lower a voltage level of the respective GIO lines to a specific level in response to respective control signals before data is inputted to the respective GIO lines.

3. The control apparatus of claim 1, further comprising a row address processing unit configured to output a row address signal by controlling an output of a block address signal with respect to a specific one of a plurality of banks according to a CAS command signal.

4. The control apparatus of claim 1, wherein the GIO control unit generates one or more of the control signals to activate operation of one or more of the plurality of GIO line termination units in response to a column address signal, a row address signal and a data transmission method select signal.

5. The control apparatus of claim 3, wherein the row address processing unit comprises:
   a plurality of address signal storage units including a transfer gate for transferring the block address signal in response to the CAS command signal; and
   a latch unit for temporarily storing an output of the address signal storage unit.

6. The control apparatus of claim 4, wherein the data transmission method select signal decides a data transmission method in any one of X4, X8 and X16 forms.

7. The control apparatus of claim 6, wherein the GIO control unit generates one or more of the control signals to activate operation of one of the plurality of GIO line termination units when the data transmission method select signal is a signal to decide the data transmission method in X4 form.

8. The control apparatus of claim 6, wherein the GIO control unit generates one or more of the control signals to activate operation of two of the plurality of GIO line termination units when the data transmission method select signal is a signal to decide the data transmission method in X8 form.

9. The control apparatus of claim 1, wherein the GIO control unit further comprises
   a pulse width control unit for controlling a pulse width of the output signal of the GIO termination select unit.

10. The control apparatus of claim 9, wherein the GIO termination select unit comprises:
    a first NAND gate for receiving a first signal and the column address signal, wherein the first signal is obtained by performing a NOR operation on first and second specific data transmission method select signals;
    a second NAND gate for receiving the row address signal and an inverted signal of the second specific data transmission method select signal as inputs;
    a third NAND gate for receiving the first signal and an output signal of the first NAND gate, as inputs; and
    a fourth NAND gate for receiving an output signal of the second NAND gate and an inverted signal of the second specific data transmission method select signal.

11. The control apparatus of claim 10, wherein the GIO termination select unit comprises:
- a fifth NAND gate for receiving an output signal of the first NAND gate and an output signal of the second NAND gate as inputs;
- a sixth NAND gate for receiving an output signal of the second NAND gate and an output signal of the third NAND gate as inputs;
- a seventh NAND gate for receiving an output signal of the first NAND gate and an output signal of the fourth NAND gate as inputs;
- an eighth NAND gate for receiving an output signal of the third NAND gate and an output signal of the fourth NAND gate as inputs; and
- first to fourth inverters for inverting outputs of the fifth to eight NAND gates, respectively, and outputting inverted signals.

12. The control apparatus of claim 9, wherein the pulse width control unit comprises:
- a normalization unit for normalizing the pulse width of the output signal of the GIO termination select unit; and
- a signal extension unit for extending an output signal of the normalization unit for a specific period of time.

13. The control apparatus of claim 12, wherein the normalization unit normalizes a pulse width of the output signal of the GIO termination select unit to a pulse width of the pulse signal in response to an output signal of the GIO termination select unit and a pulse signal having a pulse width.

14. The control apparatus of claim 12, wherein the normalization unit comprises:
- a plurality of NAND gates for receiving output signals of the GIO termination select units, respectively, and a pulse signal having a pulse width as inputs; and
- a plurality of inverters for inverting output signals of the NAND gates, respectively.

15. The control apparatus of claim 12, wherein the signal extension unit comprises:
- a plurality of inverters for inverting output signals of the normalization units, respectively;
- a plurality of delay units for delaying output signals of the inverters, respectively, for a specific period of time; and
- a plurality of NAND gates for receiving output signals of the inverters and output signals of the delay units, respectively, as inputs.

16. A method of controlling GIO lines through GIO termination, comprising the step of:
- generating a plurality of control signals to respectively terminate a plurality of GIO termination units each of which corresponds to each of the plurality of control signals according to a data transmission method,
- wherein the step of generating the control signals comprises:
- a step of receiving a column address signal, a row address signal and a data transmission method select signal, and outputting a signal to determine whether to terminate a specific GIO line group.

17. The control method of claim 16, further comprising the step of controlling an output of a block address signal with respect to a specific one of a plurality of banks according to a CAS command signal, and outputting a row address signal.

18. The control method of claim 16, wherein the step of generating the control signals includes receiving a column address signal, a row address signal and a data transmission method select signal, and generating one or more of the control signals to activate operation of one or more of the plurality of GIO termination units.

19. The control method of claim 17, wherein the step of outputting the row address signal comprises:
- a step of outputting the block address signals through a plurality of transfer gates controlled in response to a CAS command signal on a bank basis; and
- a latch step of temporarily storing the output block address signal.

20. The control method of claim 18, wherein the data transmission method select signal decides a data transmission method in any one of X4, X8 and X16 forms.

21. The control method of claim 18, wherein the step of generating the control signal includes generating one or more of the control signals to activate operation of one of the plurality of GIO termination units when the data transmission method select signal is a signal to decide the data transmission method in X4 form.

22. The control method of claim 18, wherein the step of generating the control signals includes generating one or more of the control signal to activate operation of two of the plurality of GIO termination units when the data transmission method select signal is a signal to decide the data transmission method in X8 form.

23. The control method of claim 16, wherein the step of generating the control signals further comprises
- a pulse width control step of controlling a pulse width of the signal to determine the termination.

24. The control method of claim 23, wherein the step of outputting a signal to determine the termination comprises:
- a first NAND step of performing a NAND operation on a first signal and the column address signal, wherein the first signal is obtained by a NOR operation on first and second specific data transmission method select signals;
- a second NAND step of performing a NAND operation on the row address signal and an inverted signal of the second specific data transmission method select signal;
- a third NAND step of performing a NAND operation on an output signal of the first NAND step and the first signal; and
- a fourth NAND step of performing a NAND operation on an output signal of the second NAND step and an inverted signal of the second specific data transmission method select signal.

25. The control method of claim 24, wherein the step of outputting a signal to determine the termination comprises:
- a fifth NAND step of performing a NAND operation on an output signal of the first NAND step and an output signal of the second NAND step;
- a sixth NAND step of performing a NAND operation on an output signal of the second NAND step and an output signal of the third NAND step;
- a seventh NAND step of performing a NAND operation on an output signal of the first NAND step and an output signal of the fourth NAND step;
- an eighth NAND step of performing a NAND operation on an output signal of the third NAND step and an output signal of the fourth NAND step; and
- first to fourth inverters for inverting output signals of the fifth to eighth NAND steps, respectively, and outputting inverted signals.

26. The control method of claim 23, wherein the pulse width control step comprises:
- a step of normalizing a pulse width of a signal to determine the termination; and
- a signal extension step of extending an output signal of the normalization step for a specific period of time.

27. The control method of claim 26, wherein the normalization step includes normalizing the pulse width of the signal to determine the termination to a pulse width of the pulse signal in response to the signal to determine the termination, and a pulse signal having a pulse width.

28. The control method of claim 26 wherein the normalization step comprises the steps of:
performing a NAND operation on an output signal of each of the steps of outputting the signal to determining the termination, and a pulse signal having a pulse width; and
inverting output signals of the NAND operation steps, respectively.

29. The control method of claim 26, wherein the signal extension step comprises:
a step of delaying the inverted signals for a specific period of time; and
a NAND operation step of performing a NAND operation on the inverted signal and the signal delayed for a specific period of time.

* * * * *